(12) United States Patent
Jang et al.

(10) Patent No.: US 11,680,204 B2
(45) Date of Patent: Jun. 20, 2023

(54) DOWN-SHIFTING NANOPHOSPHORS, METHOD FOR PREPARING THE SAME, AND LUMINESCENT SOLAR CONCENTRATOR USING THE SAME

(71) Applicant: KOREA INSTITUTE OF SCIENCE AND TECHNOLOGY, Seoul (KR)

(72) Inventors: Ho Seong Jang, Seoul (KR); Hyungduk Ko, Seoul (KR); Gumin Kang, Seoul (KR); So Hye Cho, Seoul (KR); Seung Yong Lee, Seoul (KR); A Ra Hong, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 188 days.

(21) Appl. No.: 17/121,766

(22) Filed: Dec. 15, 2020

(65) Prior Publication Data
US 2021/0332293 A1   Oct. 28, 2021

(30) Foreign Application Priority Data
Apr. 22, 2020   (KR) .................. 10-2020-0048566

(51) Int. Cl.
*C09K 11/77* (2006.01)
*H01L 31/055* (2014.01)
(Continued)

(52) U.S. Cl.
CPC ........... *C09K 11/7773* (2013.01); *F24S 23/11* (2018.05); *H01L 31/0445* (2014.12);
(Continued)

(58) Field of Classification Search
CPC ..... C09K 11/7773; H01L 31/055; F24S 23/11
See application file for complete search history.

(56) References Cited

U.S. PATENT DOCUMENTS

2013/0287703 A1   10/2013   Jang et al.
2016/0122635 A1*  5/2016   Liu ................... G01N 21/6428
                                                 250/473.1
(Continued)

FOREIGN PATENT DOCUMENTS

CN   104017580 B   9/2015
CN   110514825 A * 11/2019
(Continued)

OTHER PUBLICATIONS

S-L. Lin, H-C Chen, and C. A. Cheng, "Enhancing Forster resonance energy transfer (FRET) efficiency of titania-lanthanide hybrid upconversion nanomaterials by shortening the donor-acceptor distance", Nanomaterials 10, 2035 (Year: 2020).*
(Continued)

*Primary Examiner* — Ryan S Cannon
(74) *Attorney, Agent, or Firm* — Cantor Colburn LLP

(57) ABSTRACT

The present disclosure relates to down-shifting nanophosphors, a method for preparing the same, and a luminescent solar concentrator (LSC) using the same. The down-shifting nanophosphors according to an embodiment of the present disclosure include a core including $NaYF_4$ nanocrystals doped with neodymium (Nd) and ytterbium (Yb), and further include a neodymium (Nd)-doped crystalline shell surrounding the core, or further include a $NaYF_4$ crystalline shell surrounding the crystalline shell. Therefore, the down-shifting nanophosphors efficiently absorb near infrared rays with a wavelength range of 700-900 nm and efficiently emit near infrared rays with a wavelength range of 950-1050 nm. In addition, the down-shifting nanophosphors according to an embodiment of the present disclosure has a size of 60 nm or less, and thus can be applied to manufacture transparent LSC films with ease and can realize transparent solar cell modules having high near infrared ray shifting efficiency.

17 Claims, 13 Drawing Sheets

(51) Int. Cl.
  *F24S 23/00* (2018.01)
  *H01L 31/0445* (2014.01)
  *B82Y 40/00* (2011.01)
  *B82Y 20/00* (2011.01)
  *B82Y 30/00* (2011.01)

(52) U.S. Cl.
  CPC ............ *H01L 31/055* (2013.01); *B82Y 20/00* (2013.01); *B82Y 30/00* (2013.01); *B82Y 40/00* (2013.01)

(56) References Cited

U.S. PATENT DOCUMENTS

| | | | | |
|---|---|---|---|---|
| 2016/0327714 A1* | 11/2016 | Patrick | ................. | C09K 11/025 |
| 2018/0303959 A1 | 10/2018 | Jang et al. | | |
| 2019/0210886 A1* | 7/2019 | Chang | ..................... | C01F 17/36 |

FOREIGN PATENT DOCUMENTS

| | | | | | |
|---|---|---|---|---|---|
| CN | 111320199 A | * | 6/2020 | ............ | B82Y 30/00 |
| JP | 2017516316 A | | 6/2017 | | |
| KR | 1020120002220 A | | 1/2012 | | |
| KR | 1020130121554 A | | 11/2013 | | |
| KR | 101699857 B1 | | 1/2017 | | |
| KR | 1020170109972 A | | 10/2017 | | |
| KR | 1020180118370 A | | 10/2018 | | |
| WO | 2015143038 A1 | | 9/2015 | | |
| WO | WO-2019144184 A1 | * | 8/2019 | | |

OTHER PUBLICATIONS

X. Gao et al., "Sol-gel synthesis of B—NaYF4:Yb3+/Nd3+/Tm3+/Mn2+ nanophosphors and color-tunable upconversion luminescence", Journal of Fluorine Chemistry 188, p. 23-27 (Year: 2016).*
Dong Xiaobin et al., "Ultraviolet to near-infrared energy transfer in NaYF4:Nd3+,Yb3+ crystals," Journal of Rare Earths, 2016, pp. 863-867, vol. 34, No. 9.
Guanying Chen et al., "Core/Shell NaGdF4:Nd3+/NaGdF4 Nanocrystals with Efficient Near-Infrared to Near-Infrared Downconversion Photoluminescence for Bioimaging Applications," CS NANO, 2012, pp. 2969-2977, vol. 6, No. 4, American Chemical Society.
Xinyi Jiang et al., "Nd3+-doped LiYF4 nanocrystals for bioimaging in the second near-infrared window," Journal of Materials Chemistry B, 2016, pp. 87-95, vol. 4, The Royal Society of Chemistry.
Xu Chen et al., "Fabrication of Au—Ag nanocage@NaYF4@NaYF4:Yb,Er Core-Shell Hybrid and its Tunable Upconversion Enhancement," Scientific Reports, 2017, 8 pages, vol. 7, No. 41079.
Zhiying Nie et al., "NaYF4:Yb,Er,Nd@NaYF4:Nd Upconversion Nanocrystals Capped with Mn:TiO2 for 808 nm NIR-Triggered Photocatalytic Applications," The Journal of Physical Chemistry, 2019, pp. 22959-22970, vol. 123, American Chemical Society.
English Translation of Notice of Allowance dated Nov. 3, 2022 issued in corresponding Korean patent application No. 10-2020-0048566, 5 pp.
Machine Full English Translation of KR 10-2016-0061267, 27 pp.
Notice of Allowance dated Nov. 3, 2022 issued in corresponding Korean patent application No. 10-2020-0048566, 5 pp.

* cited by examiner

DOWN-SHIFTING NANOPHOSPHORS, METHOD FOR PREPARING THE SAME, AND LUMINESCENT SOLAR CONCENTRATOR USING THE SAME

CROSS-REFERENCE TO RELATED APPLICATION

This application claims priority to Korean Patent Application No. 10-2020-0048566, filed on Apr. 22, 2020, and all the benefits accruing therefrom under 35 U.S.C. § 119, the contents of which in its entirety are herein incorporated by reference.

BACKGROUND

1. Field

The present disclosure relates to down-shifting nanophosphors, a method for preparing the same, and a luminescent solar concentrator (LSC) using the same.

DESCRIPTION OF STATE-SUPPORTED RESEARCH AND DEVELOPMENT

The present disclosure is made under the support of personal basic research business of Ministry of Science and ICT (Development of High-Efficiency Up-Conversion Nanophosphors Based on Controlling Coactivator for Fluorescence Imaging Application, Subject Reference No.: 1711084598) and new & renewable energy core technology development business of Ministry and Trade, Industry and Energy (Development of Easily Extendable Transparent Solar Cell Platform, Subject Reference No.: 1415165293) with the supervision of Korea Institute of Science and Technology.

2. Background Art

Nanophosphors have a structure including a lanthanoid element doped to a matrix of oxide, fluoride, sulfide, nitride, or the like, having a size of 100 nm or less. Nanophosphors doped with a trivalent lanthanoid ion, except $Ce^{3+}$ ion, develop a unique luminescence color depending on doped lanthanoid element regardless of the type of a matrix. This is because luminescence of nanophosphors occurs due to a 4f-4f electron shift in the trivalent lanthanoid ion doped to the matrix. Therefore, there is an advantage in that particle size may be varied diversely as necessary, or a desired luminescence wavelength may be retained, even when particle size is non-uniform upon synthesis.

Meanwhile, when high-energy light, such as UV rays or visible light, is irradiated to phosphors from the outside, electrons at the ground state are excited with a partial loss of energy, and then visible light having a larger wavelength as compared to the incident light is emitted. Such a difference between absorption wavelength and emission wavelength is referred to as stokes shift. Herein, when lanthanoid elements are partially doped, excitation is generated by near infrared rays, and then infrared rays having a larger wavelength (lower energy) as compared to the excitation light are emitted. This case is referred to as down-shifting light emission, which is differentiated from up-shifting in which emission energy is higher than excitation energy.

Recently, solar cells are next-generation eco-friendly power generation systems using the solar light, an infinite energy source derived from the sun, and building-integrated photovoltaics (BIPV) have been given increasing attentions. When a silicon solar cell is applied to a transparent solar cell module as a building-integrated photovoltaic, it is disposed at the edge portion of a window. Herein, the light input to the window portion arrives at the silicon solar cell disposed at the edge of the window through total reflection. In order to allow a larger amount of energy to be transferred to the solar cell, a luminescent solar concentrator (LSC) containing a luminescence material is used. Since a silicon solar cell shows a high external quantum efficiency at 500-1000 nm, it is required for LSC not only to absorb the solar light input from the outside and to emit the visible light but also to emit near infrared rays with a wavelength of 800-1000 nm. Most of luminescence materials applied to conventional LSCs absorb light with a short wavelength and emit visible light. When a material absorbing near infrared rays having a shorter wavelength and emitting infrared rays with a wavelength of 800-1000 nm is further applied to LSCs, a larger amount of light may be transferred to the solar cell disposed at the lateral side of a LSC film.

LSC films should be transparent to realize solar cell modules. Therefore, such a material absorbing near infrared rays having a shorter wavelength and emitting infrared rays with a wavelength of 800-1000 nm or 900-1000 nm should have a significantly small size causing no light scattering. However, in the case of conventional powder phosphors, they cannot satisfy the above-mentioned property and are not suitable for solar cell modules. In the case of nanophosphors having a significantly small size, materials emitting near infrared rays with high efficiency have not yet been developed to date.

SUMMARY

A technical problem to be solved by the present disclosure is to provide down-shifting nanophosphors having a core-shell-shell structure, which has a significantly small size of 60 nm or less, absorbs near infrared rays with a specific wavelength range and efficiently emits near infrared rays with a larger wavelength of 950-1050 nm.

In one general aspect, there are provided down-shifting nanophosphors including a core containing $Nd^{3+}$- and $Yb^{3+}$-doped fluoride-based nanoparticles represented by the following Chemical Formula 1:

$$NaY_{1-x-y}F_4:Nd^{3+}{}_x,Yb^{3+}{}_y \qquad \text{[Chemical Formula 1]}$$

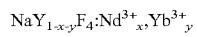

Wherein x is a real number satisfying $0.05 \leq x \leq 0.9$, and y is a real number satisfying $0 < y \leq 0.5$, with the proviso that x and y are selected within such a range that they satisfy $0.05 < x+y \leq 1$.

The down-shifting nanophosphors according to an embodiment of the present disclosure include a core containing $NaYF_4$ nanocrystals doped with neodymium (Nd) and ytterbium (Yb), and further include a neodymium (Nd)-doped crystalline shell surrounding the core, or further include a $NaYF_4$ crystalline shell surrounding the crystalline shell. Therefore, the down-shifting nanophosphors efficiently absorb near infrared rays with a wavelength range of 700-900 nm and efficiently emit near infrared rays with a wavelength range of 950-1050 nm.

In addition, the down-shifting nanophosphors according to an embodiment of the present disclosure have a size of 60 nm or less, and thus can be applied to manufacture transparent LSC films with ease and can realize transparent solar cell modules having higher near infrared ray shifting efficiency as compared to the related art.

DETAILED DESCRIPTION

Figure 1:
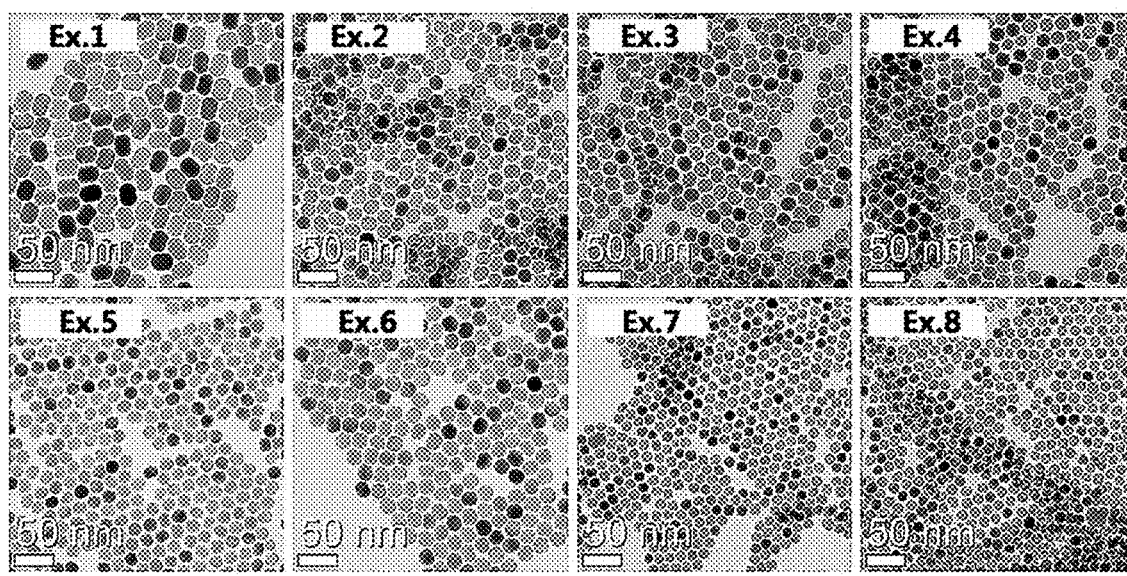
FIG. 1 illustrates a transmission electron microscopic image of the core nanophosphors according to an embodiment of the present disclosure.

Hereinafter, a detailed description of the present disclosure is given.

In one aspect of the present disclosure, there are provided down-shifting nanophosphors including a core containing $Nd^{3+}$- and $Yb^{3+}$-doped fluoride-based nanoparticles represented by the following Chemical Formula 1:

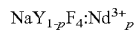
[Chemical Formula 1]

$$NaY_{1-x-y}F_4:Nd^{3+}{}_x,Yb^{3+}{}_y$$

wherein x is a real number satisfying $0.05 \leq x \leq 0.9$, and y is a real number satisfying $0 < y \leq 0.5$, with the proviso that x and y are selected within such a range that they satisfy $0.05 < x+y \leq 1$.

According to an embodiment, the down-shifting nanophosphors may further include an active shell containing a $Nd^{3+}$-doped fluoride-based crystalline compound represented by the following Chemical Formula 2, wherein the down-shifting nanophosphors may have a core-shell structure in which the active shell surrounds the core:

[Chemical Formula 2]

$$NaY_{1-p}F_4:Nd^{3+}{}_p$$

wherein p is a real number satisfying $0 < p \leq 0.5$.

According to another embodiment, the down-shifting nanophosphors may further include an inactive shell containing $NaYF_4$ nanocrystals, wherein the down-shifting nanophosphors may have a core-shell-shell structure in which the inactive shell surrounds the active shell.

The down-shifting nanophosphors according to an embodiment of the present disclosure use $NaYF_4$ crystals as cores and are doped suitably with a specific activator and coactivator, and thus can selectively absorb and emit near infrared rays with a specific wavelength range.

According to an embodiment, the core may have a size of 1-30 nm. More particularly, the core may have a particle size of 1 nm or more, 2 nm or more, 3 nm or more, 4 nm or more, 5 nm or more, 6 nm or more, 7 nm or more, 8 nm or more, 9 nm or more, 10 nm or more, 12 nm or more, 14 nm or more, 16 nm or more, 18 nm or more, 20 nm or more, 22 nm or more, 24 nm or more, 26 nm or more, or 28 nm or more. In addition, the core may have a particle size of 30 nm or less, 28 nm or less, 26 nm or less, 24 nm or less, 22 nm or less, 20 nm or less, 18 nm or less, 16 nm or less, 14 nm or less, 12 nm or less, 10 nm or less, 9 nm or less, 8 nm or less, 7 nm or less, 6 nm or less, 5 nm or less, 4 nm or less, 3 nm or less, or 2 nm or less.

According to an embodiment, the core may have a structure of hexagonal system, and the nanophosphors having a core-shell structure and the nanophosphors having a core-shell-shell structure may also have a structure of hexagonal system.

The nanophosphors having a core-shell-shell structure may have a size of 2-60 nm. More particularly, the nanophosphors having a core-shell-shell structure may have a particle size of 2 nm or more, 5 nm or more, 10 nm or more, 15 nm or more, 20 nm or more, 25 nm or more, 30 nm or more, 32 nm or more, 34 nm or more, 36 nm or more, 38 nm or more, 40 nm or more, 42 nm or more, 44 nm or more, 46 nm or more, 48 nm or more, 50 nm or more, 52 nm or more, 54 nm or more, 56 nm or more, or 58 nm or more. In addition, the nanophosphors having a core-shell-shell structure may have a particle size of 60 nm or less, 58 nm or less, 56 nm or less, 54 nm or less, 52 nm or less, 50 nm or less, 48 nm or less, 46 nm or less, 44 nm or less, 42 nm or less, 40 nm or less, 38 nm or less, 36 nm or less, 34 nm or less, 32 nm or less, 30 nm or less, 27 nm or less, 25 nm or less, 22 nm or less, 18 nm or less, 15 nm or less, 12 nm or less, 8 nm or less, 5 nm or less, or 3 nm or less.

As mentioned above, the nanophosphors according to an embodiment of the present disclosure has a significantly small size of 60 nm or less, and thus can be used to prepare a transparent polymer composite with ease and can be applied with ease to manufacture a luminescent solar concentrator in the form of a transparent film.

According to an embodiment, the down-shifting nanophosphors may absorb near infrared rays with a wavelength range of 700-900 nm and emit near infrared rays with a wavelength range of 950-1050 nm.

According to an embodiment, $Nd^{3+}$ may absorb near infrared rays with a wavelength range of 700-900 nm and $Yb^{3+}$ may emit near infrared rays with a wavelength range of 950-1050 nm.

In other words, Nd$^{3+}$ may be doped as a coactivator for absorbing near infrared rays with a wavelength range of 700-900 nm, and Yb$^{3+}$ may be doped as an activator for receiving the absorbed energy of near infrared rays and emitting near infrared rays with a wavelength range of 950-1050 nm.

In another aspect of the present disclosure, there is provided a transparent polymer composite including the down-shifting nanophosphors. Since the down-shifting nanophosphors have a uniform and small size, it is possible to obtain a significantly transparent polymer composite.

In still another aspect of the present disclosure, there is provided a luminescent solar concentrator (LSC) including the down-shifting nanophosphors.

According to an embodiment, the luminescent solar concentrator may be provided in the form of a transparent film. Since the down-shifting nanophosphors have a uniform and small size, it is possible to obtain an LSC in the form of a transparent film. In addition, since the down-shifting nanophosphors have high near infrared ray-emitting efficiency, they may be easily applied to a transparent LSC to be used for a transparent solar cell module.

In yet another aspect of the present disclosure, there is provided a method for preparing down-shifting nanophosphors for a transparent luminescent solar concentrator (TLSC), including the steps of: (1) mixing an yttrium (Y) compound, neodymium (Nd) compound, ytterbium (Yb) compound, oleic acid and 1-octadecene, followed by heating, to form a first mixed solution containing a lanthanoid complex; (2) mixing the first mixed solution with a mixed solution of a sodium (Na) compound, fluorine (F) compound and an alcohol to form a first reaction solution; and (3) removing the alcohol from the first reaction solution and carrying out heat treatment to form Nd$^{3+}$- and Yb$^{3+}$-doped fluoride-based nanoparticles represented by the above Chemical Formula 1.

According to an embodiment, the method for preparing down-shifting nanophosphors for TLSC may further include the steps of: (4) mixing an yttrium compound, neodymium compound, oleic acid and 1-octadecene, followed by heating, to form a second mixed solution containing a lanthanoid complex; (5) mixing the second mixed solution with the solution containing the nanoparticles represented by Chemical Formula 1, obtained from step (3), and with a mixed solution of a sodium compound, fluorine compound and an alcohol to form a second reaction solution; and (6) removing the alcohol from the second reaction solution and carrying out heat treatment to form active shells containing a Nd$^{3+}$-doped fluoride-based crystalline compound represented by the above Chemical Formula 2 on the surfaces of the cores including the nanoparticles represented by Chemical Formula 1, thereby providing nanophosphors having a core-shell structure.

According to an embodiment, the method for preparing down-shifting nanophosphors for TLSC may further include the steps of: (7) mixing an yttrium compound, oleic acid and 1-octadecene, followed by heating, to form a third mixed solution; (8) mixing the third mixed solution with the solution containing the cores and the active shells, obtained from step (6), and with a mixed solution of a sodium compound, fluorine compound and an alcohol to form a third reaction solution; and (9) removing the alcohol from the third reaction solution and carrying out heat treatment to form inactive shells containing NaYF$_4$ nanocrystals on the surfaces of the active shells, thereby providing nanophosphors having a core-shell-shell structure.

According to an embodiment, the ytterbium compound in step (1) may be any one selected from the group consisting of ytterbium chloride hydrate (YbCl$_3$.6H$_2$O), ytterbium acetate (Yb(CH$_3$COO)$_3$), ytterbium chloride (YbCl$_3$) and a combination thereof.

According to an embodiment, the neodymium compound in steps (1) and (4) may be any one selected from the group consisting of neodymium chloride hydrate (NdCl$_3$.6H$_2$O), neodymium acetate (Nd(CH$_3$COO)$_3$), neodymium chloride (NdCl$_3$) and a combination thereof.

According to an embodiment, the yttrium compound in steps (1), (4) and (7) may be any one selected from the group consisting of yttrium chloride hydrate (YCl$_3$.6H$_2$O), yttrium acetate (Y(CH$_3$COO)$_3$), yttrium chloride (YCl$_3$) and a combination thereof.

According to an embodiment, the alcohol may be any one selected from C1-C4 lower alcohols, preferably methanol.

According to an embodiment, the sodium compound may be sodium hydroxide, and the fluorine compound may be ammonium fluoride.

According to an embodiment, the heating in steps (1), (4) and (7) may be carried out at a temperature of 100-200° C. More particularly, the heating in steps (1), (4) and (7) may be carried out at a temperature of 100° C. or higher, 110° C. or higher, 120° C. or higher, 130° C. or higher, 140° C. or higher, 150° C. or higher, 160° C. or higher, 170° C. or higher, 180° C. or higher, or 190° C. or higher. In addition, the heating in steps (1), (4) and (7) may be carried out at a temperature of 200° C. or lower, 190° C. or lower, 180° C. or lower, 170° C. or lower, 160° C. or lower, 150° C. or lower, 140° C. or lower, 130° C. or lower, 120° C. or lower, or 110° C. or lower.

According to an embodiment, the heat treatment in steps (3), (6) and (9) may be carried out at 200-400° C. for 10-200 minutes.

According to another embodiment, the heat treatment in steps (3), (6) and (9) may be carried out at a temperature of 200° C. or higher, 220° C. or higher, 240° C. or higher, 260° C. or higher, 280° C. or higher, 300° C. or higher, 320° C. or higher, 340° C. or higher, 360° C. or higher, or 380° C. or higher. In addition, the heat treatment in steps (3), (6) and (9) may be carried out at a temperature of 400° C. or lower, 380° C. or lower, 360° C. or lower, 340° C. or lower, 320° C. or lower, 300° C. or lower, 280° C. or lower, 260° C. or lower, 240° C. or lower, or 220° C. or lower.

According to still another embodiment, the heat treatment in steps (3), (6) and (9) may be carried out for 10 minutes or more, 20 minutes or more, 30 minutes or more, 40 minutes or more, 50 minutes or more, 60 minutes or more, 70 minutes or more, 80 minutes or more, 90 minutes or more, 100 minutes or more, 120 minutes or more, 140 minutes or more, 160 minutes or more, or 180 minutes or more. In addition, the heat treatment in steps (3), (6) and (9) may be carried out for 200 minutes or less, 180 minutes or less, 160 minutes or less, 140 minutes or less, 120 minutes or less, 100 minutes or less, 90 minutes or less, 80 minutes or less, 70 minutes or less, 60 minutes or less, 50 minutes or less, 40 minutes or less, 30 minutes or less, or 20 minutes or less.

Hereinafter, the present disclosure will be described in detail with reference to examples and test examples. However, it will be apparent to those skilled in the art that these examples and test examples are provided for illustrative purposes only and the following examples are not intended to limit the scope of the present disclosure. It should be understood that various modifications, substitutions and

<Example 1> Synthesis of $NaY_{0.85}F_4:Nd^{3+}_{0.05},Yb^{3+}_{0.1}$ Core Nanophosphors Core nanophosphors having a core represented by the chemical formula of $NaY_{0.85}F_4:Nd^{3+}_{0.05},Yb^{3+}_{0.1}$ were synthesized through the following steps.

1. Step of preparing first mixed solution: 0.85 mmol of yttrium chloride hydrate ($YCl_3.6H_2O$), 0.05 mmol of neodymium chloride hydrate ($NdCl_3.6H_2O$) and 0.1 mmol of ytterbium chloride hydrate ($YbCl_3.6H_2O$) were mixed with 6 mL of oleic acid and 15 mL of 1-octadecene as a solvent, and heated to 150° C. to prepare a first mixed solution including a lanthanoid complex.
2. Step of preparing first reaction solution: 10 mL of methanol solution containing 2.5 mmol of sodium hydroxide and 4 mmol of ammonium fluoride was mixed with the first mixed solution including the lanthanoid complex to prepare a first reaction solution.
3. Step of forming nanoparticles: Methanol was removed from the first reaction solution and the resultant product was heat treated at a temperature of 320° C. under argon (Ar) gas atmosphere for 60 minutes. During the heat treatment, beta ($\beta$)-$NaY_{0.85}F_4:Nd^{3+}_{0.05},Yb^{3+}_{0.1}$ nanoparticles having a structure of hexagonal system were formed. The resultant nanoparticles were washed with ethanol, dispersed in a non-polar solvent, such as hexane, toluene or chloroform, and stored.

<Example 2> Synthesis of $NaY_{0.8}F_4:Nd^{3+}_{0.1},Yb^{3+}_{0.1}$ Core Nanoparticles Beta ($\beta$)-$NaY_{0.8}F_4:Nd^{3+}_{0.1},Yb^{3+}_{0.1}$ nanoparticles having a structure of hexagonal system were synthesized in the same manner as Example 1, except that 0.8 mmol of yttrium chloride hydrate ($YCl_3.6H_2O$) and 0.1 mmol of neodymium chloride hydrate ($NdCl_3.6H_2O$) were used. The resultant nanoparticles were washed with ethanol, dispersed in a non-polar solvent, such as hexane, toluene or chloroform, and stored.

<Example 3> Synthesis of $NaY_{0.75}F_4:Nd^{3+}_{0.15},Yb^{3+}_{0.1}$ Core Nanoparticles Beta ($\beta$)-$NaY_{0.75}F_4:Nd^{3+}_{0.15},Yb^{3+}_{0.1}$ nanoparticles having a structure of hexagonal system were synthesized in the same manner as Example 1, except that 0.75 mmol of yttrium chloride hydrate ($YCl_3.6H_2O$) and 0.15 mmol of neodymium chloride hydrate ($NdCl_3.6H_2O$) were used. The resultant nanoparticles were washed with ethanol, dispersed in a non-polar solvent, such as hexane, toluene or chloroform, and stored.

<Example 4> Synthesis of $NaY_{0.7}F_4:Nd^{3+}_{0.2},Yb^{3+}_{0.1}$ Core Nanoparticles Beta ($\beta$)-$NaY_{0.7}F_4:Nd^{3+}_{0.2},Yb^{3+}_{0.1}$ nanoparticles having a structure of hexagonal system were synthesized in the same manner as Example 1, except that 0.7 mmol of yttrium chloride hydrate ($YCl_3.6H_2O$) and 0.2 mmol of neodymium chloride hydrate ($NdCl_3.6H_2O$) were used. The resultant nanoparticles were washed with ethanol, dispersed in a non-polar solvent, such as hexane, toluene or chloroform, and stored.

<Example 5> Synthesis of $NaY_{0.65}F_4:Nd^{3+}_{0.25},Yb^{3+}_{0.1}$ Core Nanoparticles Beta ($\beta$)-$NaY_{0.65}F_4:Nd^{3+}_{0.25},Yb^{3+}_{0.1}$ nanoparticles having a structure of hexagonal system were synthesized in the same manner as Example 1, except that 0.65 mmol of yttrium chloride hydrate ($YCl_3.6H_2O$) and 0.25 mmol of neodymium chloride hydrate ($NdCl_3.6H_2O$) were used. The resultant nanoparticles were washed with ethanol, dispersed in a non-polar solvent, such as hexane, toluene or chloroform, and stored.

<Example 6> Synthesis of $NaY_{0.6}F_4:Nd^{3+}_{0.3},Yb^{3+}_{0.1}$ Core Nanoparticles Beta ($\beta$)-$NaY_{0.6}F_4:Nd^{3+}_{0.3},Yb^{3+}_{0.1}$ nanoparticles having a structure of hexagonal system were synthesized in the same manner as Example 1, except that 0.6 mmol of yttrium chloride hydrate ($YCl_3.6H_2O$) and 0.3 mmol of neodymium chloride hydrate ($NdCl_3.6H_2O$) were used. The resultant nanoparticles were washed with ethanol, dispersed in a non-polar solvent, such as hexane, toluene or chloroform, and stored.

<Example 7> Synthesis of $NaY_{0.5}F_4:Nd^{3+}_{0.4},Yb^{3+}_{0.1}$ Core Nanoparticles Beta ($\beta$)-$NaY_{0.5}F_4:Nd^{3+}_{0.4},Yb^{3+}_{0.1}$ nanoparticles having a structure of hexagonal system were synthesized in the same manner as Example 1, except that 0.5 mmol of yttrium chloride hydrate ($YCl_3.6H_2O$) and 0.4 mmol of neodymium chloride hydrate ($NdCl_3.6H_2O$) were used. The resultant nanoparticles were washed with ethanol, dispersed in a non-polar solvent, such as hexane, toluene or chloroform, and stored.

<Example 8> Synthesis of $NaY_{0.4}F_4:Nd^{3+}_{0.5},Yb^{3+}_{0.1}$ Core Nanoparticles Beta ($\beta$)-$NaY_{0.4}F_4:Nd^{3+}_{0.5},Yb^{3+}_{0.1}$ nanoparticles having a structure of hexagonal system were synthesized in the same manner as Example 1, except that 0.4 mmol of yttrium chloride hydrate ($YCl_3.6H_2O$) and 0.5 mmol of neodymium chloride hydrate ($NdCl_3.6H_2O$) were used. The resultant nanoparticles were washed with ethanol, dispersed in a non-polar solvent, such as hexane, toluene or chloroform, and stored.

Each of the core nanophosphors according to Examples 1-8 was observed by using a transmission electron microscope (TEM) (Model: Tecnai F20, FEI). The TEM image is shown in FIG. 1. As shown in FIG. 1, it can be seen that the core nanophosphors according to an embodiment of the present disclosure show a uniform size of 30 nm or less.

Figure 2:
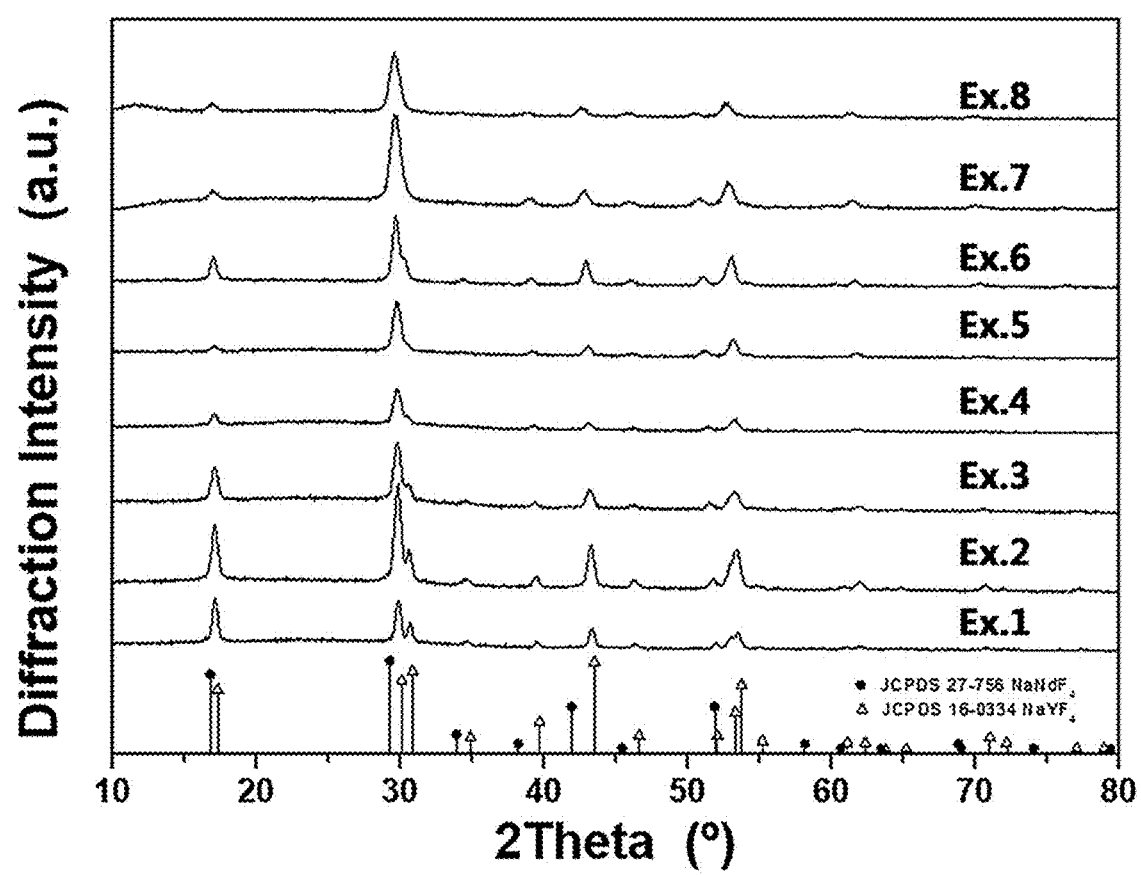
FIG. 2 illustrates an X-ray diffraction pattern of the core nanophosphors according to an embodiment of the present disclosure.

Each of the core nanophosphors according to Examples 1-8 was analyzed by X-ray diffractometry using D8-Advance (Bruker). The results are shown in FIG. 2. As shown in FIG. 2, it can be seen that the core nanophosphors according to Examples 18 show a diffraction pattern conformed to the diffraction pattern of $NaYF_4$ crystals (reference) having a structure of hexagonal system, and thus are present in a single hexagonal crystal phase free from impurities.

Figure 3:
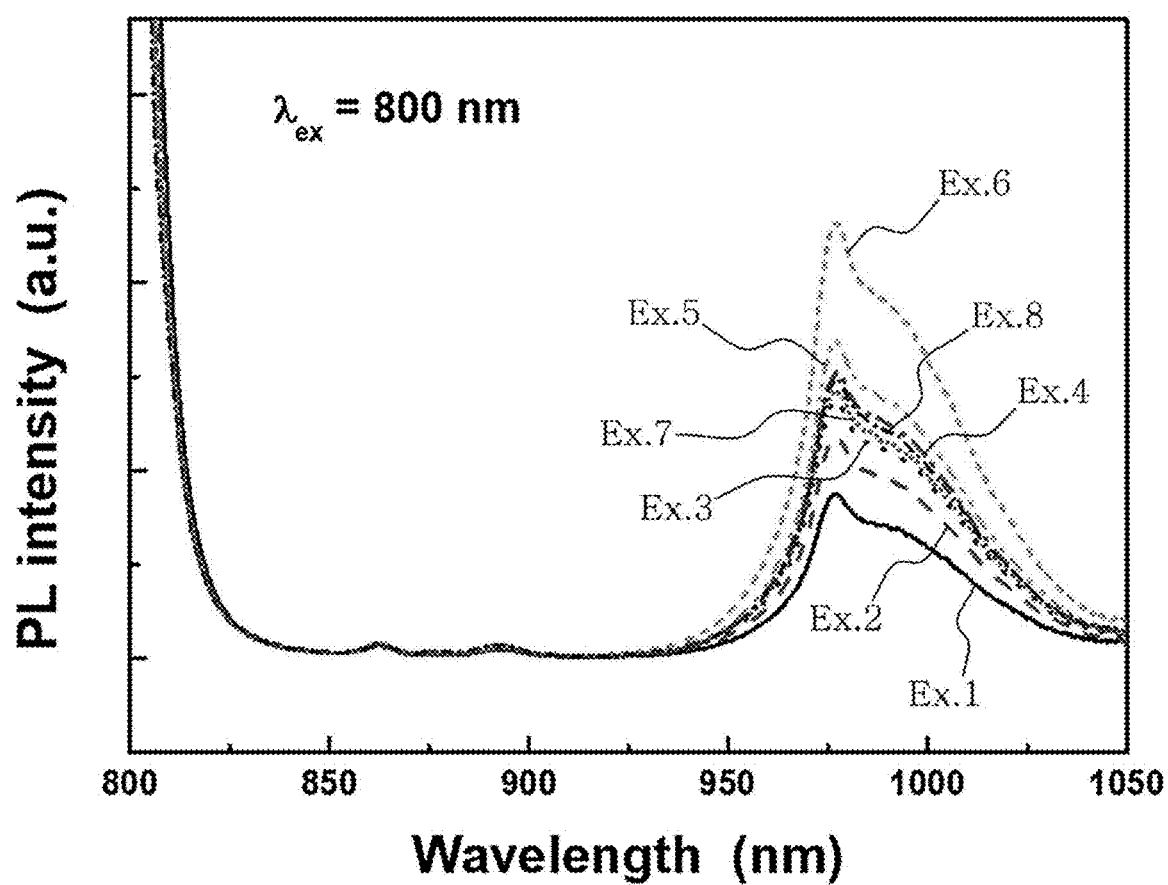
FIG. 3 illustrates a photoluminescence (PL) spectrum of the core nanophosphors according to an embodiment of the present disclosure.

Each of the core nanophosphors according to Examples 1-8 was analyzed by photoluminescence (PL) spectrometry using a spectrophotometer (F-7000, Hitachi). The results are shown in FIG. 3. As shown in FIG. 3, it can be seen that the core nanophosphors according to Examples 1-8 show a broad near infrared ray emission band in a range of 950-1050 nm around a center of about 977 nm. Particularly, it can be seen that the core nanophosphors according to Example 6 show the highest light emission intensity.

<Example 9> Synthesis of Nanophosphors Having Core-Shell Structure Including $NaY_{0.6}F_4:Nd^{3+}{}_{0.3}$, $Yb^{3+}{}_{0.1}$ (Core)-$NaYF_4$ (Shell)

Nanophosphors having a core-shell structure including the nanophosphors according to Example 6 as cores surrounded with $NaYF_4$ crystalline shells were synthesized through the following steps.

1. Step of preparing second mixed solution: 1 mmol of yttrium chloride hydrate ($YCl_3.6H_2O$) was mixed with 6 mL of oleic acid and 15 mL of 1-octadecene as a solvent and heated to 150° C. to prepare a second mixed solution including a lanthanoid complex.

2. Step of preparing second reaction solution: 10 mL of the core nanophosphor solution synthesized according to Example 6 was introduced to the second mixed solution including a lanthanoid complex, and the resultant mixture was mixed with 10 mL of methanol solution containing 2.5 mmol of sodium hydroxide and 4 mmol of ammonium fluoride to prepare a second reaction solution.

3. Step of forming nanoparticles: Methanol was removed from the second reaction solution and heat treated at a temperature of 320° C. under argon gas atmosphere for 60 minutes. During the heat treatment, beta ($\beta$)-$NaY_{0.6}F_4:Nd^{3+}{}_{0.3},Yb^{3+}{}_{0.1}$ (core)-$NaYF_4$ (shell) nanoparticles were formed. The resultant core-shell nanoparticles were washed with ethanol, dispersed in a non-polar solvent, such as hexane, toluene or chloroform, and stored.

<Example 10> Synthesis of Nanophosphors Having Core-Shell Structure Including $NaY_{0.6}F_4:Nd^{3+}{}_{0.3}$, $Yb^{3+}{}_{0.1}$ (Core)-$NaY_{0.9}F_4:Nd^{3+}{}_{0.1}$ (Shell)

Beta (($\beta$)-$NaY_{0.6}F_4:Nd^{3+}{}_{0.3},Yb^{3+}{}_{0.1}$ (core)-$NaY_{0.9}F_4:Nd^{3+}{}_{0.1}$ (shell) nanoparticles were synthesized in the same manner as Example 9, except that 0.9 mmol of yttrium chloride hydrate ($YCl_3.6H_2O$) and 0.1 mmol of neodymium chloride hydrate ($NdCl_3.6H_2O$) were mixed with 6 mL of oleic acid and 15 mL of 1-octadecene in the step of forming a second mixed solution. The resultant core-shell nanoparticles were washed with ethanol, dispersed in a non-polar solvent, such as hexane, toluene or chloroform, and stored.

<Example 11> Synthesis of Nanophosphors Having Core-Shell Structure Including $NaY_{0.6}F_4:Nd^{3+}{}_{0.3}$, $Yb^{3+}{}_{0.1}$ (Core)-$NaY_{0.8}F_4:Nd^{3+}{}_{0.2}$ (Shell)

Beta ($\beta$)-$NaY_{0.6}F_4:Nd^{3+}{}_{0.3},Yb^{3+}{}_{0.1}$ (core)-$NaY_{0.8}F_4:Nd^{3+}{}_{0.2}$ (shell) nanoparticles were synthesized in the same manner as Example 9, except that 0.8 mmol of yttrium chloride hydrate ($YCl_3.6H_2O$) and 0.2 mmol of neodymium chloride hydrate ($NdCl_3.6H_2O$) were mixed with 6 mL of oleic acid and 15 mL of 1-octadecene in the step of forming a second mixed solution. The resultant core-shell nanoparticles were washed with ethanol, dispersed in a non-polar solvent, such as hexane, toluene or chloroform, and stored.

Figure 4:
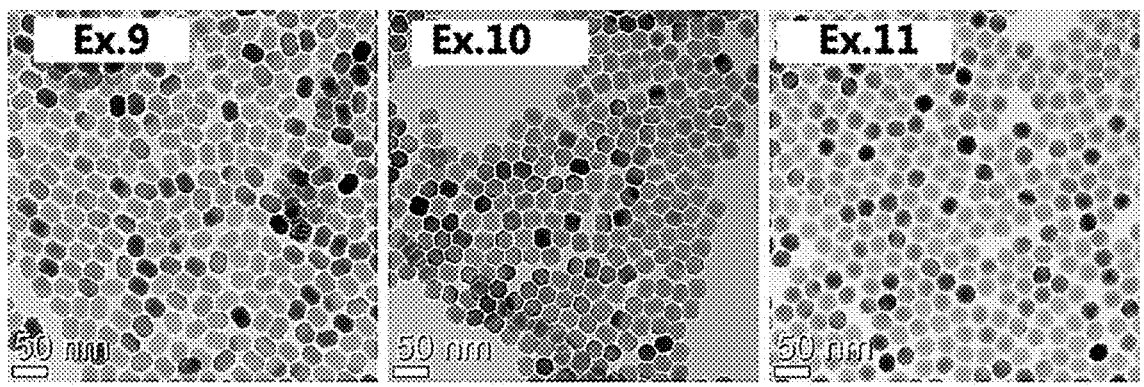
FIG. 4 illustrates a transmission electron microscopic image of the nanophosphors having a core-shell structure according to an embodiment of the present disclosure.

Each of the core-shell nanophosphors according to Examples 9-11 was observed by using a transmission electron microscope (TEM) (Model: Tecnai F20, FEI). The TEM image is shown in FIG. 4. When comparing FIG. 4 to FIG. 1, it can be seen that the particles have an increased size, since the shells surrounding the cores are formed.

Figure 5:
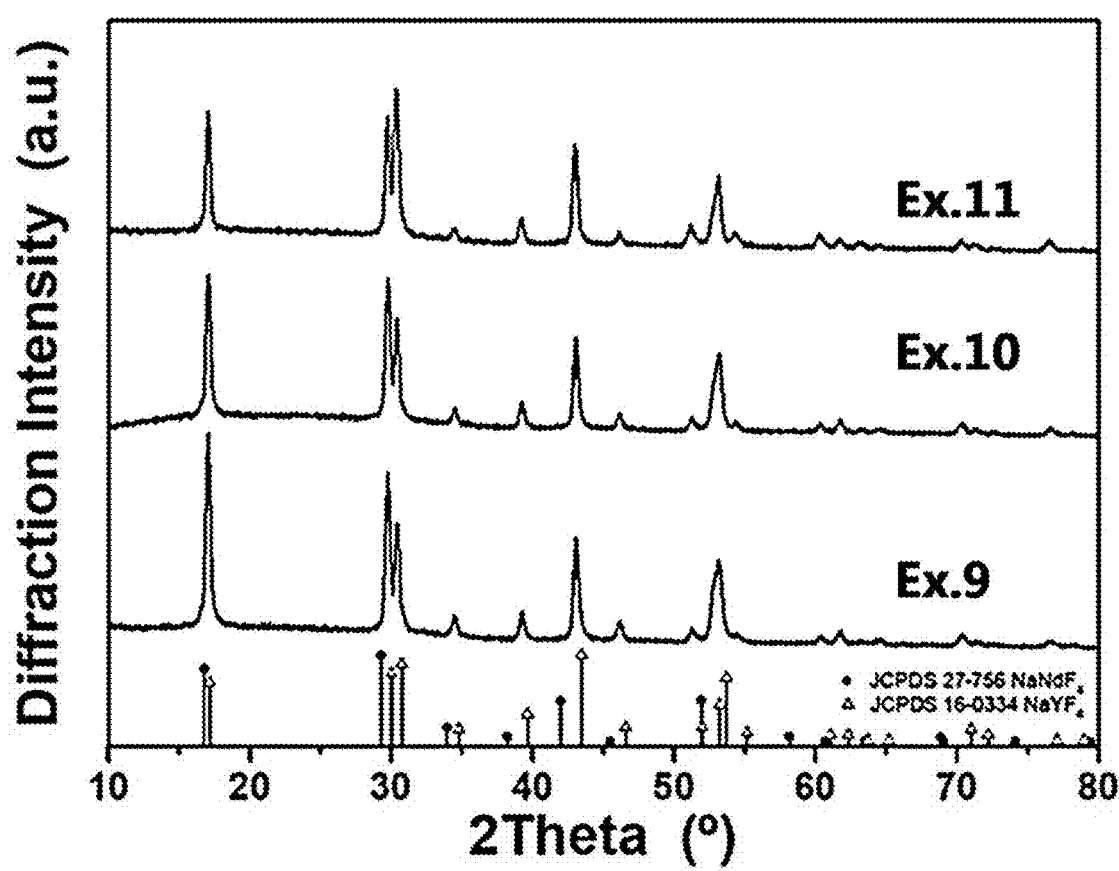
FIG. 5 illustrates an X-ray diffraction pattern of the nanophosphors having a core-shell structure according to an embodiment of the present disclosure.

Each of the core-shell nanophosphors according to Examples 9-11 was analyzed by X-ray diffractometry using D8-Advance (Bruker). The results are shown in FIG. 5. As shown in FIG. 5, it can be seen that the core-shell nanophosphors according to Examples 9-11 show a diffraction pattern conformed to the diffraction pattern of $NaYF_4$ crystals (reference) having a structure of hexagonal system, and thus are present in a single hexagonal crystal phase free from impurities.

Figure 6:
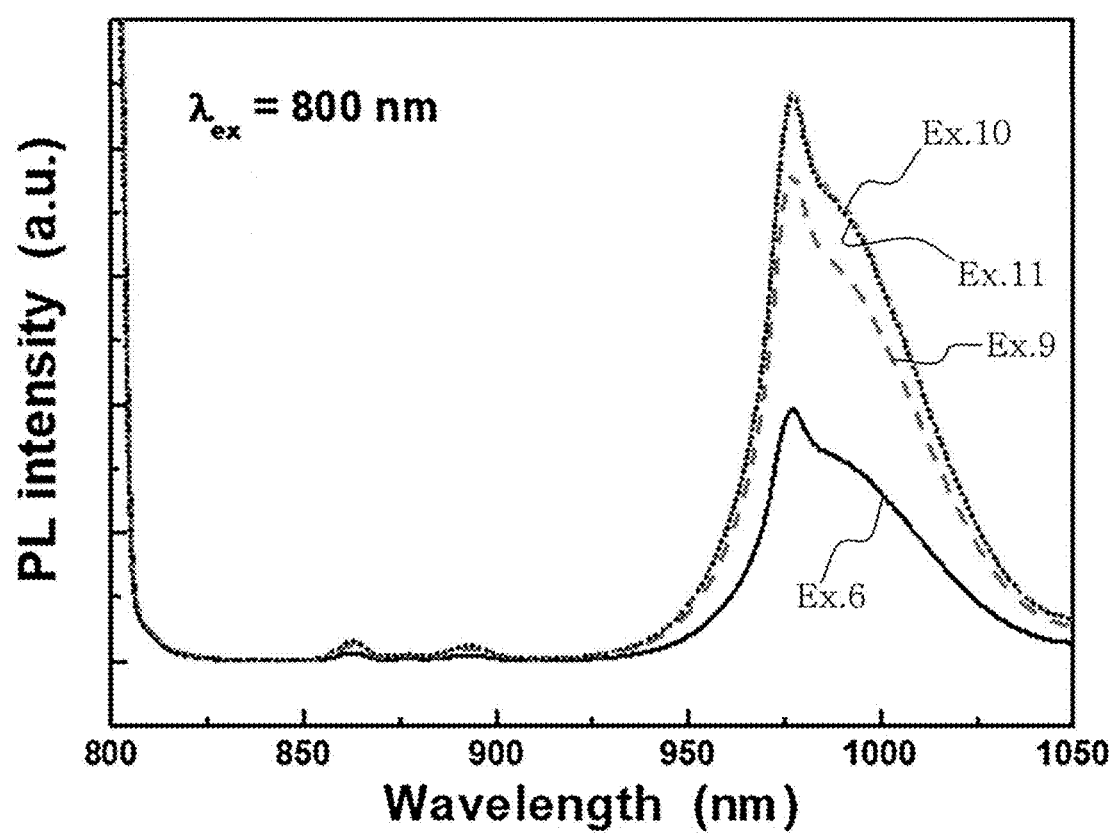
FIG. 6 illustrates a PL spectrum of the nanophosphors having a core-shell structure according to an embodiment of the present disclosure.

Each of the core nanophosphors according to Example 6 and the core-shell nanophosphors according to Examples 9-11 was analyzed by photoluminescence (PL) spectrometry using a spectrophotometer (F-7000, Hitachi). The results are shown in FIG. 6. As shown in FIG. 6, it can be seen that the core-shell nanophosphors according to Examples 9-11 show significantly high light emission intensity corresponding to twice or more of the light emission intensity of the core nanophosphors due to the formation of the shells surrounding the cores. It can be also seen that Examples 10 and 11 including $NaYF_4$ crystals doped with neodymium show significantly higher light emission intensity as compared to Example 9 including shells, not doped with neodymium, and show a light emission intensity about 2.3 times of the light emission intensity of the core nanophosphors according to Example 6. Particularly, it can be seen that the nanophosphors including shells doped with 10% of neodymium according to Example 10 show the highest light emission intensity.

<Example 12> Synthesis of Nanophosphors Having Core-Shell-Shell Structure Including $NaY_{0.6}F_4$: $Nd^{3+}{}_{0.3},Yb^{3+}{}_{0.1}$ (Core)-$NaY_{0.9}F_4:Nd^{3+}{}_{0.1}$ (Shell)-$NaYF_4$ (Shell)

Nanophosphors having a core-shell-shell structure including the nanophosphors having a core-shell structure according to Example 10 surrounded with $NaYF_4$ crystalline inactive shells were synthesized through the following steps.

1. Step of preparing third mixed solution: 1 mmol of yttrium chloride hydrate ($YCl_3.6H_2O$) was mixed with 6 mL of oleic acid and 15 mL of 1-octadecene as a solvent and heated to 150° C. to prepare a third mixed solution.

2. Step of preparing third reaction solution: 10 mL of the core-shell nanophosphor solution synthesized according to Example 10 was introduced to the third mixed solution, and the resultant mixture was mixed with 10 mL of methanol solution containing 2.5 mmol of sodium hydroxide and 4 mmol of ammonium fluoride to prepare a third reaction solution.

3. Step of forming nanoparticles: Methanol was removed from the third reaction solution and heat treated at a temperature of 320° C. under argon gas atmosphere for 60 minutes. During the heat treatment, beta ($\beta$)-$NaY_{0.6}F_4:Nd^{3+}{}_{0.3},Yb^{3+}{}_{0.1}$ (core)-$NaY_{0.9}F_4:Nd^{3+}{}_{0.1}$ (Shell)-$NaYF_4$ (shell) nanoparticles were formed. The resultant core-shell-shell nanoparticles were washed with ethanol, dispersed in a non-polar solvent, such as hexane, toluene or chloroform, and stored.

Figure 7:
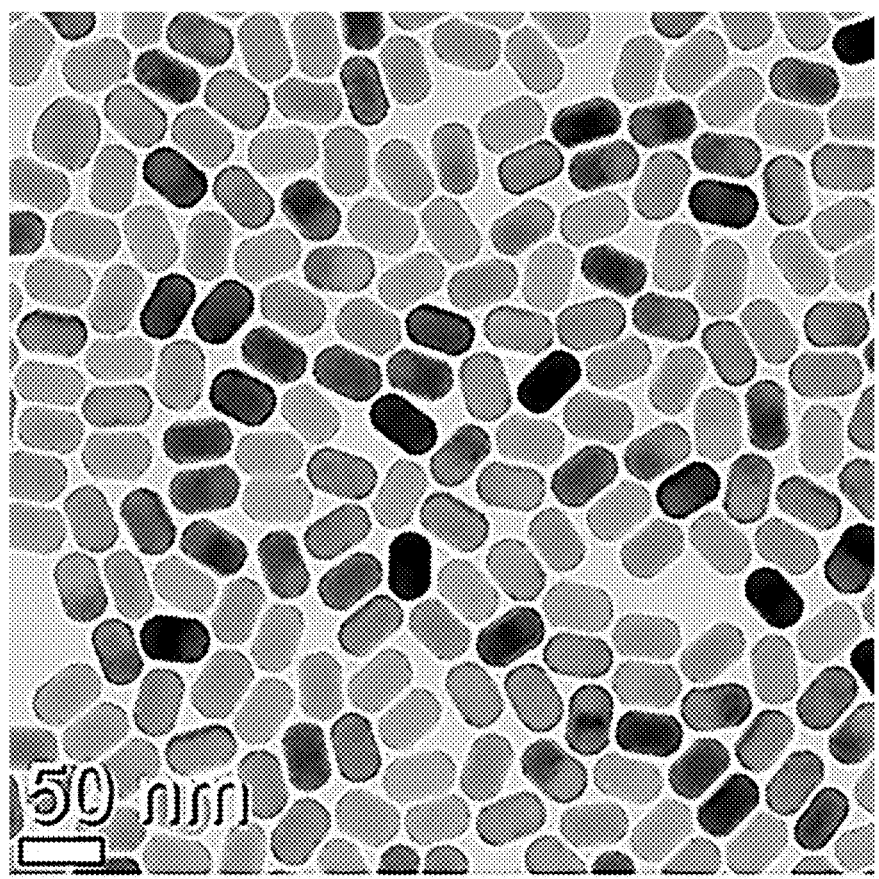
FIG. 7 illustrates a transmission electron microscopic image of the nanophosphors having a core-shell-shell structure according to an embodiment of the present disclosure.

The core-shell-shell nanophosphors according to Example 12 were observed by using a transmission electron microscope (TEM) (Model: Tecnai F20, FEI). The TEM image is shown in FIG. 7. When comparing FIG. 7 to FIG. 4, it can be seen that the particles have an increased size, since the crystalline shells were further formed on the core-shell structures.

Figure 8:
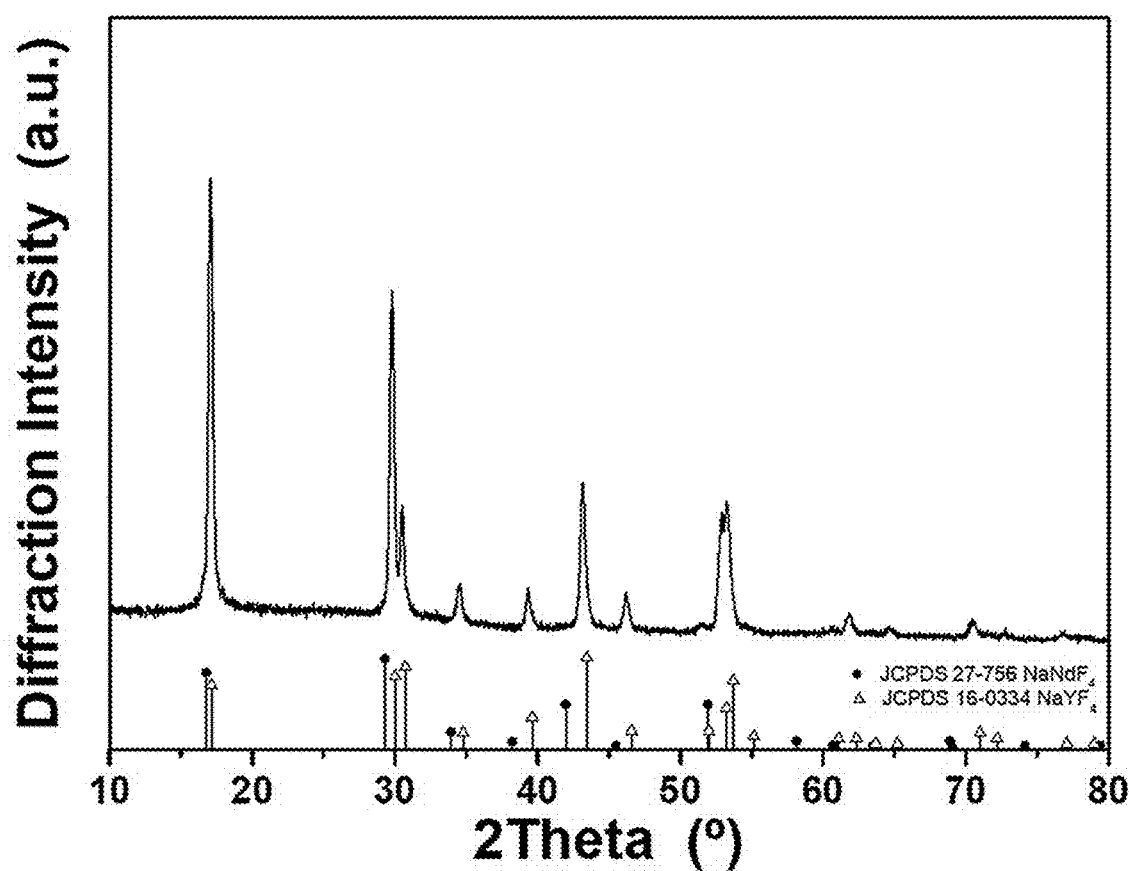
FIG. 8 illustrates an X-ray diffraction pattern of the nanophosphors having a core-shell-shell structure according to an embodiment of the present disclosure.

The core-shell-shell nanophosphors according to Example 12 were analyzed by X-ray diffractometry using D8-Advance (Bruker). The results are shown in FIG. 8. As shown in FIG. 8, it can be seen that the core-shell-shell nanophosphors according to Example 12 show a diffraction pattern conformed to the diffraction pattern of $NaYF_4$ crystals (reference) having a structure of hexagonal system, and thus hexagonal-system shells are further formed uniformly around the core-shell structure of hexagonal-system with no impurities.

Figure 9:
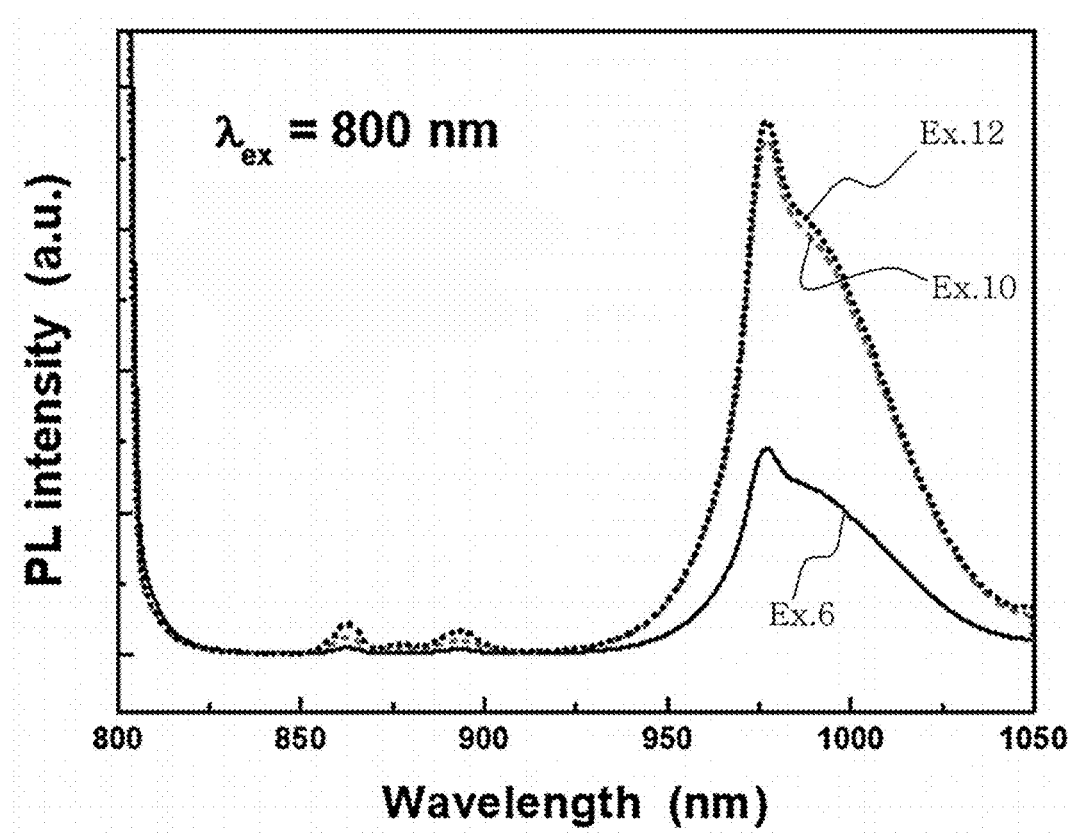
FIG. 9 illustrates a PL spectrum of the nanophosphors having a core-shell-shell structure according to an embodiment of the present disclosure.

Each of the core nanophosphors according to Example 6, the core-shell nanophosphors according to Example 10 and the core-shell-shell nanophosphors according to Example 12 was analyzed by photoluminescence (PL) spectrometry using a spectrophotometer (F-7000, Hitachi). The results are shown in FIG. 9. As shown in FIG. 9, it can be seen that the core-shell nanophosphors according to Example 10 and the core-shell-shell nanophosphors according to Example 12 show significantly high light emission intensity corresponding to twice or more of the light emission intensity of the core nanophosphors. It can be also seen that the core-shell-shell nanophosphors further including the second shells show higher light emission intensity as compared to the core-shell nanophosphors. Particularly, the core-shell-shell nanophosphors show a light emission intensity about 2.6 times of the light emission intensity of the core nanophosphors according to Example 6.

<Example 13> Manufacture of Transparent Polymer Film Including Nanophosphors Having Core-Shell-Shell Structure Including $NaY_{0.6}F_4:Nd^{3+}_{0.3}$, $Yb^{3+}_{0.1}$ (Core)-$NaY_{0.9}F_4:Nd^{3+}_{0.1}$ (Shell)-$NaYF_4$ (Shell)

First, 0.5 mL of the core-shell-shell nanophosphors obtained from Example 12 were mixed with 10 mL of polydimethylsiloxane (PDMS) polymer and 1 mL of SYLGARD 184 as a curing agent to obtain a polymer mixture including the core-shell-shell nanophosphors. The polymer mixture was allowed to stand at 80° C. for 1 hour and cooled to room temperature to obtain a transparent polymer film including nanophosphors.

Figure 10:
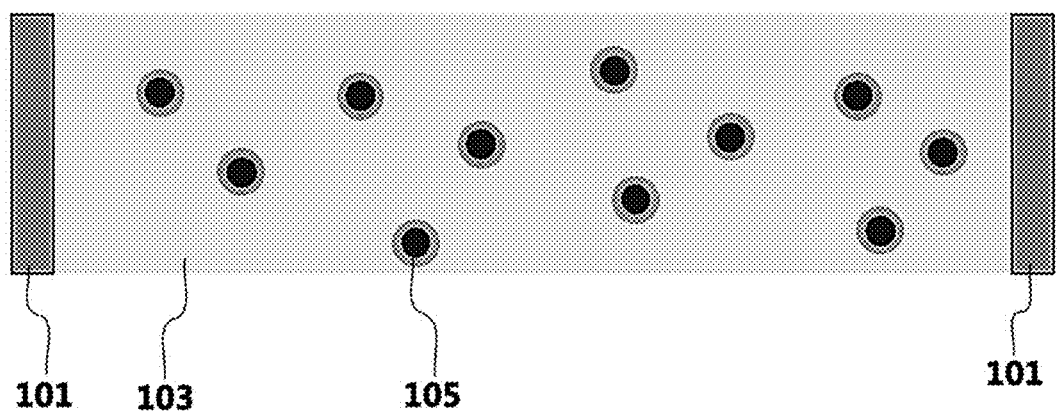
FIG. 10 is a schematic view illustrating a transparent solar cell module using a luminescent solar concentrator (LSC) film including the nanophosphors having a core-shell-shell structure according to an embodiment of the present disclosure and a solar cell.

The resultant transparent polymer film may be applied to a luminescent solar concentrator (LSC). FIG. 10 is a schematic view illustrating a transparent solar cell module using the transparent polymer film including the nanophosphors according to an embodiment of the present disclosure and a solar cell.

As shown in FIG. 10, a transparent solar cell module may be obtained by applying the transparent polymer film including the core-shell-shell nanophosphors 105 according to an embodiment of the present disclosure to an LSC film 103 and applying solar cells 101 to both sides thereof.

Figure 11:
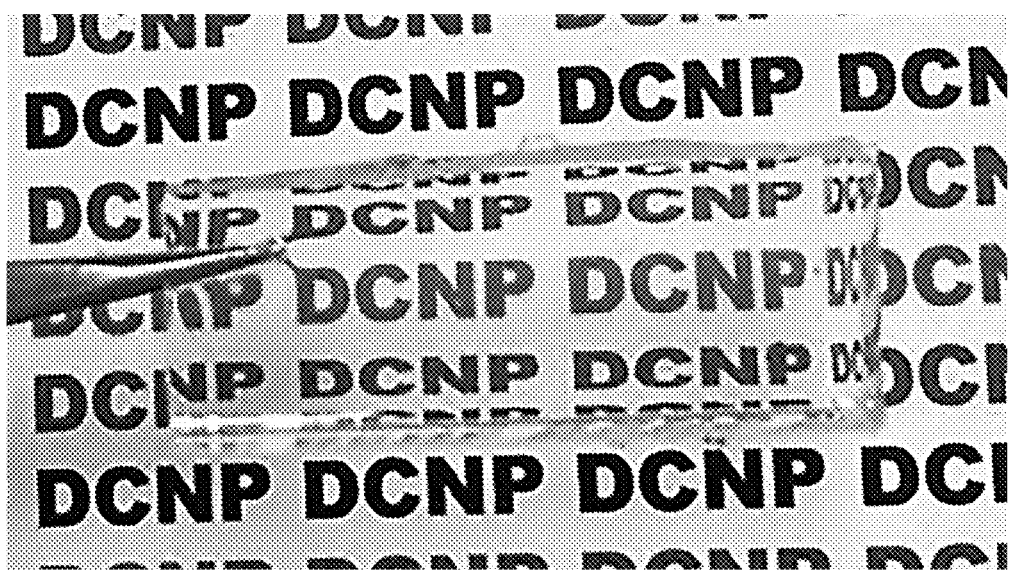
FIG. 11 illustrates a photographic image of a transparent polymer film (LSC film) obtained by using the nanophosphors having a core-shell-shell structure according to an embodiment of the present disclosure.

FIG. 11 illustrates a photographic image of a transparent polymer film including the nanophosphors having a core-shell-shell structure according to Example 13. As shown in FIG. 11, it can be seen that the polymer film including the nanophosphors according to an embodiment of the present disclosure is significantly transparent.

Figure 12:
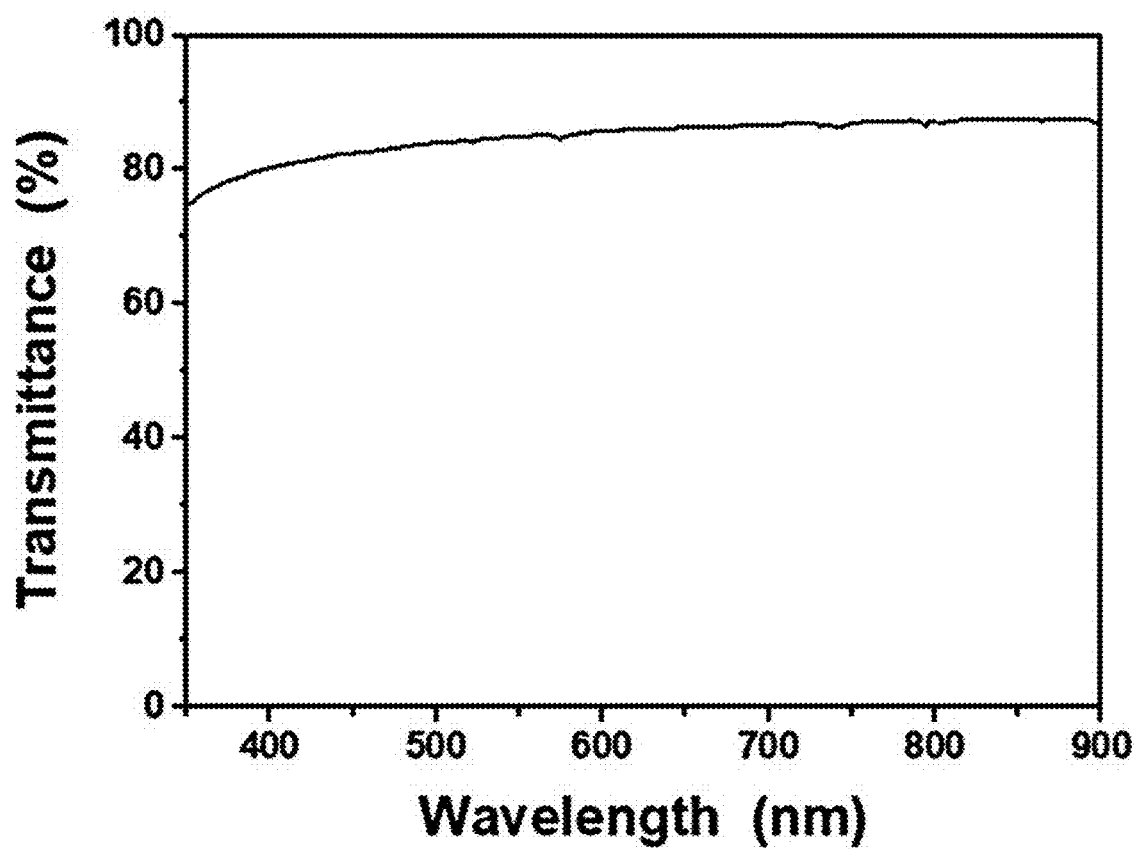
FIG. 12 illustrates a transmittance spectrum of a transparent polymer film (LSC film) obtained by using the nanophosphors having a core-shell-shell structure according to an embodiment of the present disclosure.

The transparent polymer film including the nanophosphors having a core-shell-shell structure according to Example 13 was analyzed by Lambda25 spectrometer (Perkin-Elmer) to obtain a transmittance spectrum. FIG. 12 illustrates the transmittance spectrum. It can be seen from the result of FIG. 12 that the transparent polymer film including the nanophosphors having a core-shell-shell structure according to an embodiment of the present disclosure shows a high transmittance of 78.7% or more in the visible light region.

Figure 13:
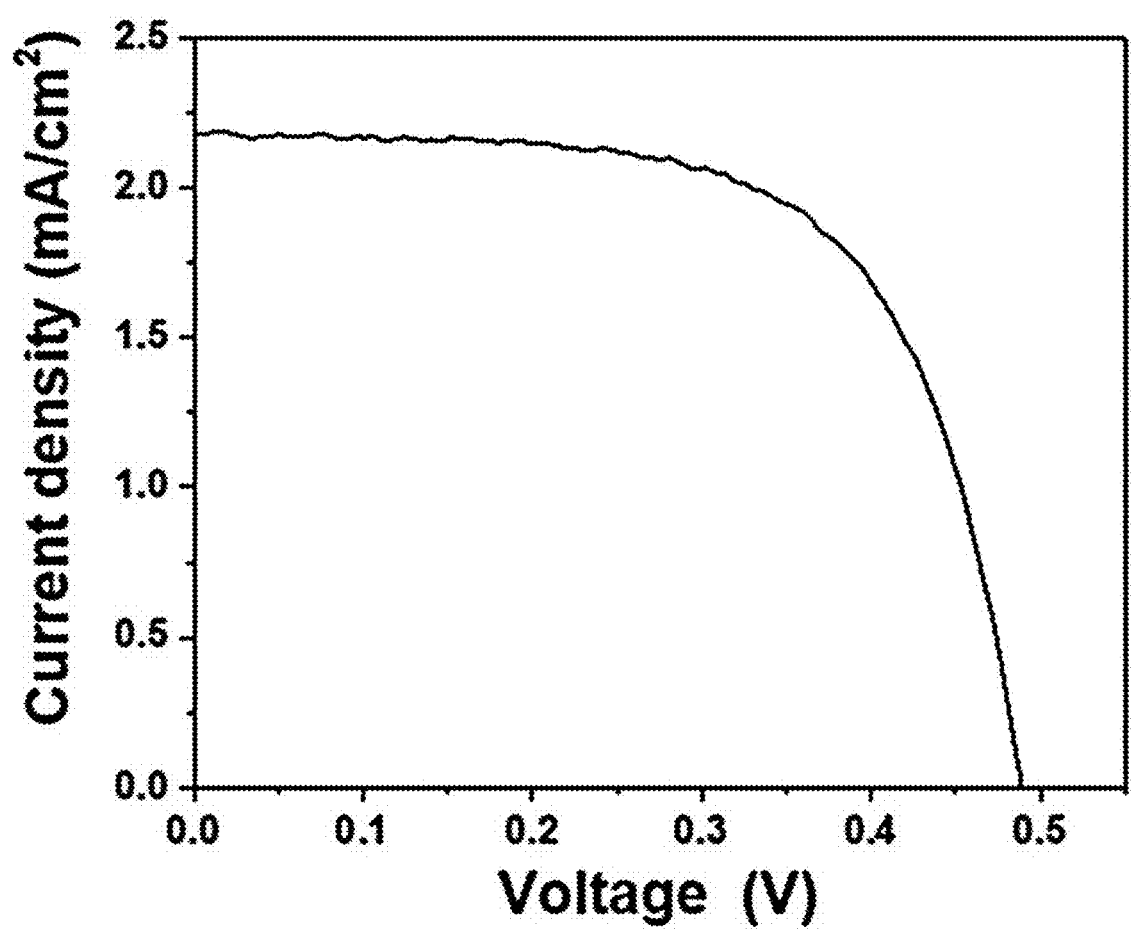
FIG. 13 is a voltage-current density graph of a solar cell determined by using a transparent polymer film (LSC film) obtained by using the nanophosphors having a core-shell-shell structure according to an embodiment of the present disclosure.

In addition, a solar cell was obtained by using the transparent polymer film including the nanophosphors having a core-shell-shell structure according to Example 13 as an LSC and determined for voltage and electric current by using AM 1.5 G (100 mWcm$^{-2}$) light source of XES 301S solar simulator available from SAN-EI ELECTRIC Co. and 2400 source meter available from Keithley Co. The result is shown in FIG. 13. It can be seen from the result of FIG. 13 that when using the transparent polymer film including the core-shell-shell nanophosphors showing near infrared ray emission according to an embodiment of the present disclosure, as an LSC film, it is possible to obtain an efficiency of about 0.7%.

DESCRIPTION OF DRAWING NUMERALS

101: Solar cell
103: Luminescent solar concentrator film (LSC film)
105: Core-shell-shell down-shifting nanophosphors

What is claimed is:

1. Down-shifting nanophosphors comprising a core-shell-shell structure including a core of $Nd^{3+}$-doped and $Yb^{3+}$-doped fluoride-based nanoparticles represented by the following Chemical Formula 1:

$$NaY_{1-x-y}F_4:Nd^{3+}_x,Yb^{3+}_y \qquad \text{[Chemical Formula 1]}$$

wherein x is a real number satisfying 0.05≤x≤0.9, and y is a real number satisfying 0<y≤0.5, with the proviso that 0.05<x+y≤1,
an active shell that surrounds the core, and
an inactive shell containing $NaYF_4$ nanocrystals, wherein the inactive shell surrounds the active shell, wherein the down-shifting nanophosphors absorb near infrared rays with a wavelength range of 700-900 nm and emit near infrared rays with a wavelength range of 950-1050 nm.

2. The down-shifting nanophosphors according to claim 1, wherein the active shell comprises a $Nd^{3+}$-doped fluoride-based crystalline compound represented by the following Chemical Formula 2:

$$NaY_{1-p}F_4:Nd^{3+}_p \qquad \text{[Chemical Formula 2]}$$

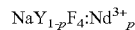

wherein p is a real number satisfying 0<p≤0.5.

3. The down-shifting nanophosphors according to claim 1, wherein the core has a size of 1-30 nm.

4. The down-shifting nanophosphors according to claim 1, wherein the core has a structure of hexagonal system.

5. The down-shifting nanophosphors according to claim 1, wherein the core-shell-shell structure has a size of 2-60 nm.

6. The down-shifting nanophosphors according to claim 1, which have a structure of hexagonal system.

7. The down-shifting nanophosphors according to claim 1, wherein $Nd^{3+}$ absorbs the near infrared rays with a wavelength range of 700-900 nm, and $Yb^{3+}$ emits the near infrared rays with a wavelength range of 950-1050 nm.

8. The down-shifting nanophosphors according to claim 1, wherein the core nanoparticles represented by Chemical Formula 1, x is a real number satisfying 0.15≤x≤0.4, and y is a real number satisfying 0<y≤0.1 with the proviso that 0.25<x+y≤0.5.

9. A transparent polymer composite comprising the down-shifting nanophosphors as defined in claim 1.

10. A luminescent solar concentrator (LSC) comprising the down-shifting nanophosphors as defined in claim 1.

11. The luminescent solar concentrator according to claim 10, which is provided in the form of a transparent film.

12. A method for preparing down-shifting nanophosphors for a transparent luminescent solar concentrator (TLSC), comprising the steps of:
(1) mixing an yttrium (Y) compound, neodymium (Nd) compound, ytterbium (Yb) compound, oleic acid and 1-octadecene, followed by heating, to form a first mixed solution containing a lanthanoid complex;
(2) mixing the first mixed solution with a mixed solution of a sodium compound, fluorine compound and an alcohol to form a first reaction solution;
(3) removing the alcohol from the first reaction solution and carrying out heat treatment to form $Nd^{3+}$- and $Yb^{3+}$-doped fluoride-based nanoparticles having a structure of hexagonal system represented by the following Chemical Formula 1:

$$NaY_{1-x-y}F_4:Nd^{3+}{}_x,Yb^{3+}{}_y \qquad \text{[Chemical Formula 1]}$$

wherein x is a real number satisfying $0.05 \le x \le 0.9$, and y is a real number satisfying $0 < y \le 0.5$, with the proviso that $0.05 < x+y \le 1$;
(4) mixing an yttrium compound, neodymium compound, oleic acid and 1-octadecene, followed by heating, to form a second mixed solution containing a lanthanoid complex,
(5) mixing the second mixed solution with the solution containing the nanoparticles represented by Chemical Formula 1, obtained from step (3), and with a mixed solution of a sodium compound, flourine compound and an alcohol to form a second reaction solution;
(6) removing the alcohol from the second reaction solution and carrying out heat treatment to form active shells containing a $Nd^{3+}$-doped fluoride-based crystalline compound represented by the following Chemical Formula 2 on the surfaces of the cores including the nanoparticles represented by Chemical Formula 1, thereby providing nanophosphors having a core-shell structure:

$$NaY_{1-p}F_4:Nd^{3+}{}_p \qquad \text{[Chemical Formula 2]}$$

wherein p is a real number satisfying $0 < p \le 0.5$;
(7) mixing an yttrium compound, oleic acid and 1-octadecene, followed by heating, to form a third mixed solution;
(8) mixing the third mixed solution with the solution containing the cores and the active shells, obtained from step (6), and with a mixed solution of a sodium compound, fluorine compound and an alcohol to form a third reaction solution; and
(9) removing the alcohol from the third reaction solution and carrying out heat treatment to form inactive shells containing $NaYF_4$ nanocrystals on the surfaces of the active shells, thereby providing nanophosphors having a core-shell-shell structure, wherein the nanophosphors absorb near infrared rays with a wavelength range of 700-900 nm and emit near infrared rays with a wavelength range of 950-1050 nm.

13. The method for preparing down-shifting nanophosphors for a transparent luminescent solar concentrator (TLSC) according to claim 12, wherein, in at least one of the first reaction solution, the second reaction solution, and the third reaction solution, the ytterbium compound is any one selected from the group consisting of ytterbium chloride hexahydrate ($YbCl_3.6H_2O$), ytterbium acetate ($Yb(CH_3COO)_3$), ytterbium chloride ($YbCl_3$) and a combination thereof; the neodymium compound is any one selected from the group consisting of neodymium chloride hexahydrate ($NdCl_3.6H_2O$), neodymium acetate ($Nd(CH_3COO)_3$), neodymium chloride ($NdCl_3$) and a combination thereof; the yttrium compound is any one selected from the group consisting of yttrium chloride hexahydrate ($YCl_3.6H_2O$), yttrium acetate ($Y(CH_3COO)_3$), yttrium chloride ($YCl_3$) and a combination thereof; and the alcohol is any one selected from C1-C4 lower alcohols.

14. The method for preparing down-shifting nanophosphors for a transparent luminescent solar concentrator (TLSC) according to claim 12, wherein, in at least one of the first reaction solution, the second reaction solution, and the third reaction solution, the neodymium compound is any one selected from the group consisting of neodymium chloride hexahydrate ($NdCl_3.6H_2O$), neodymium acetate ($Nd(CH_3COO)_3$), neodymium chloride ($NdCl_3$) and a combination thereof; the yttrium compound is any one selected from the group consisting of yttrium chloride hexahydrate ($YCl_3.6H_2O$), yttrium acetate ($Y(CH_3COO)_3$), yttrium chloride ($YCl_3$) and a combination thereof; and the alcohol is any one selected from C1-C4 lower alcohols.

15. The method for preparing down-shifting nanophosphors for a transparent luminescent solar concentrator (TLSC) according to claim 12, wherein, in at least one of the first reaction solution, the second reaction solution, and the third reaction solution, the yttrium compound is any one selected from the group consisting of yttrium chloride hexahydrate ($YCl_3.6H_2O$), yttrium acetate ($Y(CH_3COO)_3$), yttrium chloride ($YCl_3$) and a combination thereof, and
the alcohol is any one selected from C1-C4 lower alcohols.

16. The method for preparing down-shifting nanophosphors for a transparent luminescent solar concentrator (TLSC) according to claim 12, wherein the heat treatment in step (3) is carried out at a temperature of 200-400° C. for 10-200 minutes.

17. The method for preparing down-shifting nanophosphors for a transparent luminescent solar concentrator (TLSC) according to claim 12, wherein the heat treatment in steps (6) and (9) is carried out at a temperature of 200-400° C. for 10-200 minutes.

* * * * *